US009551752B2

(12) United States Patent
Krekeler et al.

(10) Patent No.: US 9,551,752 B2
(45) Date of Patent: Jan. 24, 2017

(54) DUAL GROUND BREAKER TESTING SYSTEM

(71) Applicant: Vanguard Instruments Company, Inc., Ontario, CA (US)

(72) Inventors: Steve Krekeler, Monrovia, CA (US); Marcio Linhares, Barnet (GB)

(73) Assignee: Vanguard Instruments Company, Inc., Ontario, CA (US)

( * ) Notice: Subject to any disclaimer, the term of this patent is extended or adjusted under 35 U.S.C. 154(b) by 382 days.

(21) Appl. No.: 14/156,858

(22) Filed: Jan. 16, 2014

(65) Prior Publication Data

US 2015/0198667 A1    Jul. 16, 2015

(51) Int. Cl.
*G01R 31/327* (2006.01)
*G01R 31/333* (2006.01)

(52) U.S. Cl.
CPC ......... *G01R 31/3272* (2013.01); *G01R 31/327* (2013.01); *G01R 31/333* (2013.01); *G01R 31/3271* (2013.01); *G01R 31/3333* (2013.01)

(58) Field of Classification Search
CPC .............. G01R 31/327; G01R 31/3271; G01R 31/3272; G01R 31/333; G01R 31/3333; H01H 71/08; H01H 83/04
USPC ........ 324/127, 418, 423, 424; 361/102, 115; 335/6, 7
See application file for complete search history.

(56) References Cited

U.S. PATENT DOCUMENTS

| 3,398,357 | A | * | 8/1968 | Colclaser, Jr. | G01R 31/3336 |
| | | | | | 324/103 R |
| 4,996,646 | A | * | 2/1991 | Farrington | H02H 3/00 |
| | | | | | 307/132 E |
| 5,426,360 | A | * | 6/1995 | Maraio | G01R 15/142 |
| | | | | | 324/126 |
| 6,963,203 | B2 | * | 11/2005 | Stanisic | G01R 31/3272 |
| | | | | | 324/423 |
| 2004/0189307 | A1 | * | 9/2004 | Rudholm | G01R 31/3274 |
| | | | | | 324/421 |
| 2004/0189319 | A1 | * | 9/2004 | Stanisic | G01R 31/3272 |
| | | | | | 324/523 |
| 2010/0283491 | A1 | * | 11/2010 | Zurek | G01R 27/20 |
| | | | | | 324/713 |

(Continued)

FOREIGN PATENT DOCUMENTS

| AT | EP 2700962 A1 * | 2/2014 | ........... G01R 27/205 |
| AT | EP 2708907 A1 * | 3/2014 | ........... G01R 27/205 |

(Continued)

OTHER PUBLICATIONS

Megger, TM1700-series Circuit Breaker Analyzer System, www.megger.com, 2012.*

(Continued)

*Primary Examiner* — Jermele M Hollington
*Assistant Examiner* — Sean Curtis
(74) *Attorney, Agent, or Firm* — Pasadena Legal Group; Norman R. Van Treeck

(57) ABSTRACT

A system for testing substation circuit breakers while the circuit breakers are grounded on both sides using a ground clamp probe electrically connected to one side of the circuit breaker contacts, where the ground clamp probe provides a means of interfacing standard test equipment to the circuit breaker without removing either safety ground, and analyzing the circuit breaker and outputting the results to a technician on a display.

24 Claims, 9 Drawing Sheets

(56) References Cited

U.S. PATENT DOCUMENTS

| | | | | |
|---|---|---|---|---|
| 2012/0074929 A1* | 3/2012 | Wobschall | ............ | G01R 15/181 |
| | | | | 324/126 |
| 2014/0055142 A1* | 2/2014 | Klapper | ............... | G01R 27/205 |
| | | | | 324/421 |
| 2014/0232509 A1* | 8/2014 | Shaw | .................... | H01F 27/362 |
| | | | | 336/84 C |
| 2015/0198667 A1* | 7/2015 | Krekeler | ............ | G01R 31/3272 |
| | | | | 324/424 |

FOREIGN PATENT DOCUMENTS

| | | | | |
|---|---|---|---|---|
| CN | 103969576 A | * | 8/2014 | |
| CN | 203870217 U | * | 10/2014 | |
| CN | 104459529 A | * | 3/2015 | |

OTHER PUBLICATIONS

KoCoS America, IEEE Switchgear Committee: Testing Breakers with Both Sides Grounded, N/A.*

Claesson et al., High Voltage Circuit Breaker Testing with Dual Grounding, Application, May 2008.*

* cited by examiner

DUAL GROUND BREAKER TESTING SYSTEM

FIELD OF THE INVENTION

The present invention relates to a system for testing power substation circuit breakers, and more specifically to a system that tests substation circuit breakers while the circuit breakers are grounded on both sides providing increased safety.

BACKGROUND

Typical power substation circuit breakers are used to open or close 3-phase power lines to energize or de-energize a city block or bigger load. The utility companies service the circuit breakers, but before they can put them back in service, they need to insure that the circuit breakers perform within their specified operating parameters. One such operating parameter is the contact opening and closing time (in milliseconds).

Before the utility personnel can even touch the circuit breaker, they must take the circuit breaker off the transmission line (by opening the circuit breaker) and isolating it. One of the safety requirements is to put safety grounds on both sides of the circuit breaker contact. These safety grounds eliminate any static discharge in the circuit breaker contact so that the personnel will not get shocked when they touch the circuit breaker. Additionally, these grounds are used to conduct any line power close to the circuit breaker while the personnel are working. The ground will take the line power to ground and create a fault (over current) on the transmission line. In this case, the protection system will de-energize the entire circuit and hopefully save the crew.

Current methods of testing substation circuit breakers generally involve testing an "off-line" circuit breaker by applying a voltage or current source to the circuit breaker contacts, electrically energizing the breaker, and measuring the voltage and/or current at the circuit breaker terminals. Open, close, open-close, close-open, or open-close-open timing characteristics can then be derived based upon the timing of the voltages and currents at the circuit breaker terminals with respect to the initiation sequence. An open pair of circuit breaker contacts is indicated by the presence of voltage and the absence of current at the circuit breaker terminals, while a closed pair of circuit breaker contacts will be indicated by the absence of voltage and the presence of current at the circuit breaker terminals.

However, safety practices currently in place in many substation environments require that each terminal of the circuit breaker be physically connected to earth ground with a low-resistance shunt while the circuit breaker is not in use (i.e. "offline"). These earth grounds present a short-circuit condition to the traditional test equipment, and therefore the circuit breaker always looks to be in the closed state. In practice, it is necessary to remove at least one of the safety grounds from the circuit breaker prior to testing, and to reinstall the ground(s) after testing is complete. This procedure is not desirable as it introduces a possibility that the ground may not be reconnected after the test, presenting a safety hazard.

Therefore there is a need for a system that tests substation circuit breakers while the circuit breakers are grounded on both sides providing increased safety.

SUMMARY

The present invention overcomes the limitations of the prior art by providing a system that tests substation circuit breakers while the circuit breakers are grounded on both sides providing increased safety. In order to overcome the problems inherent in the prior art, the invention discloses a test probe that has been developed (hereinafter a ground clamp probe). The ground clamp probe 202 is clamped onto one of the ground leads of the breaker, and provides an output that indicates if the circuit breaker 102 is closed or open. The ground clamp probe 202 provides a means of interfacing standard test equipment to the circuit breaker 102 without removing the safety ground. The ground clamp probe 202 is able to reflect changes in the state of the circuit breaker 102 contacts very quickly measuring the response time in as little as 50-100 micro-seconds.

The system also comprises a method for testing substation circuit breakers while the circuit breakers are electrically grounded on both sides by coupling the load-side contact and the line-side contact of a circuit breaker to electrical ground, magnetically coupling to the loop created by the electrical grounds and contact pair by means of clamp-on transformers, inducing an excitation voltage and current into the loop by exciting the primary winding of the clamp-on transformer, detecting the current induced in the contact loop by means of a current transformer in the clamp on transformer, and determining the state of the circuit breaker contact pair based upon the detected current and voltage measurements.

BRIEF DESCRIPTION OF THE DRAWINGS

These and other features, aspects and advantages of the present invention will become better understood with regard to the following description, appended claims, and accompanying Figures where:

DETAILED DESCRIPTION

Figure 1:
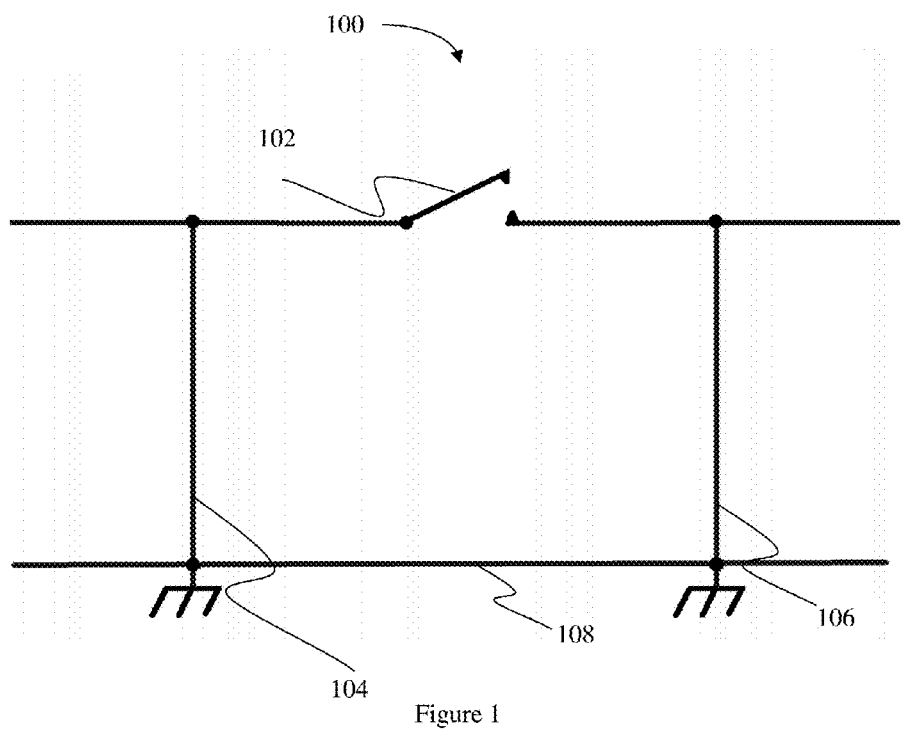
FIG. 1 is a diagram of circuit breaker contacts with the safety grounds installed.

All dimensions specified in this disclosure are by way of example only and are not intended to be limiting. Further, the proportions shown in these Figures are not necessarily to scale. As will be understood by those with skill in the art with reference to this disclosure, the actual dimensions and proportions of any system, any device or part of a system or device disclosed in this disclosure will be determined by its intended use.

Methods and devices that implement the embodiments of the various features of the system will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment.

Throughout the drawings, reference numbers are re-used to indicate correspondence between referenced elements. In addition, the first digit of each reference number indicates the Figure where the element first appears.

As used in this disclosure, except where the context requires otherwise, the term "comprise" and variations of the term, such as "comprising", "comprises" and "comprised" are not intended to exclude other additives, components, integers or steps.

In the following description, specific details are given to provide a thorough understanding of the embodiments. However, it will be understood by one of ordinary skill in the art that the embodiments may be practiced without these specific details. Well-known circuits, structures and techniques may not be shown in detail in order not to obscure the embodiments. For example, circuits may be shown in block diagrams in order not to obscure the embodiments in unnecessary detail.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be rearranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or a combination thereof. When implemented in software, firmware, middleware or microcode, the program code or code segments to perform the necessary tasks may be stored in a machine-readable medium such as a storage medium or other storage(s). One or more than one processor, computer, microcontroller or any combination thereof can perform, or execute instructions, necessary to accomplish the tasks in series, distributed, concurrently or in parallel manner as is understood by those with skill in the art. A code segment may represent a procedure, a function, a subprogram, a program, a routine, a subroutine, a module, a software package, a class, or a combination of instructions, data structures, or program statements. A code segment may be coupled to another code segment or a hardware circuit by passing and/or receiving information, data, arguments, parameters, or memory contents. Information, arguments, parameters, data, etc. Can be passed, forwarded, or transmitted through a suitable means including memory sharing, message passing, token passing, network transmission, etc.

Various embodiments provide for a system that tests substation circuit breakers while the circuit breakers are grounded on both sides providing increased safety. One embodiment of the present invention provides a device to test substation circuit breakers while the circuit breakers are grounded on both sides. In another embodiment, there is provided a method for testing substation circuit breakers while the circuit breakers are grounded on both sides. The system, device and method will now be disclosed in detail.

Referring now to FIG. 1, there is shown a diagram 100 of circuit breaker 102 contacts with the safety grounds installed 104 and 106. The two safety grounds 104 and 106 and the earth ground 108 between them forms a closed ground loop consisting of the grounding circuit 104, 106 and 108 and the circuit breaker 102 contacts. This invention uses the fact that the ground loop 104, 106 and 108 will provide a closed path to circulate induced current if the circuit breaker contacts 102 are closed, but will not provide a closed path for circulating currents if the circuit breaker 102 contacts are open.

Figure 2:
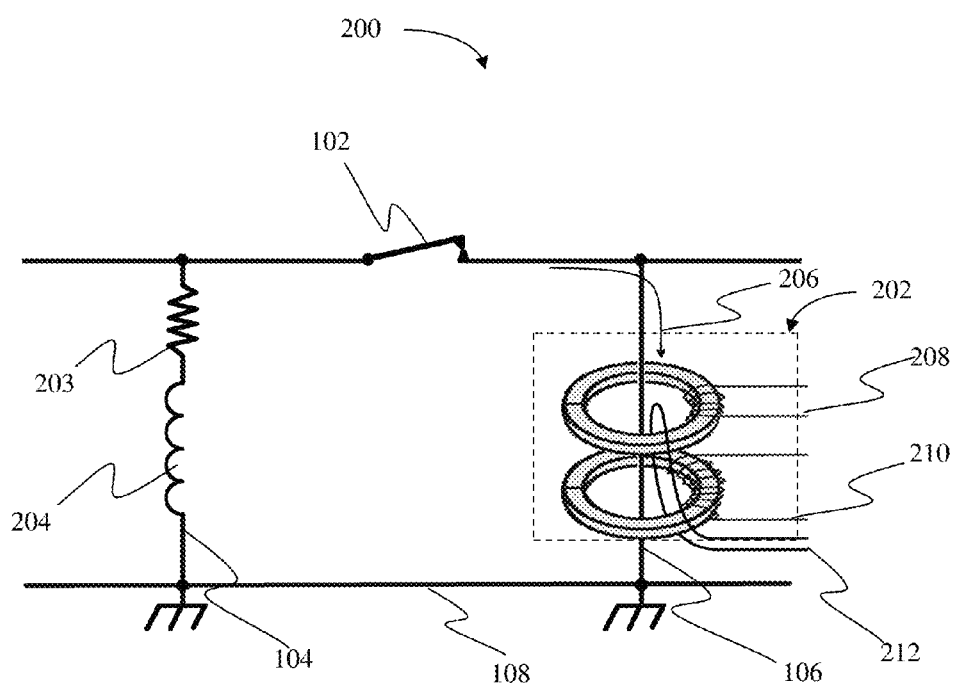
FIG. 2 is a diagram of a ground clamp probe attached to the circuit breaker according to one embodiment of the present invention.

Referring now to FIG. 2, there is shown a diagram 200 of a ground clamp probe 202 attached to the circuit breaker 102 according to one embodiment of the present invention. As can be seen, the ground clamp probe 202 can comprise two split-core transformers 208 and 210 with isolated and shielded cores (shields are not shown) that can be clamped onto one of the safety ground wires 106. In this embodiment, the two split-core transformers 208 and 210 are of a split-core design comprising a drive coil 208 and a current sense coil 210, and are fitted into the jaws of a hand-operated self-closing clamp (not shown). Applying a high frequency AC voltage to the drive coil 208 will induced flux that will couple to the ground loop 104, 106, and 108. This applied ground loop acts as a shorted secondary of the drive transformer. A current $I_{loop}$ 206 will flow in the ground loop. The drive coil 208 that comprises N turns, where N is at least 20 turns, will form a N:1 transformer with the single turn ground loop passing through the center of the jaws. If the drive coil 208 current is around 1 amps peak, then the ground loop current, $I_{loop}$ 206 will be N times this, or 20 A peak. This is a large current, and easily detectable by the sense transformer 210.

In practice, ground loop current may be limited by the impedance of the ground loop 104, 106 and 108, represented by resistance (R) 203 and inductance (L) 204. The ground loop 104, 106 and 108 impedance Z with a closed circuit breaker 102 can be calculated:

$$Z = j2\pi fL + R \qquad \text{(equation 1)}$$

Where f is the drive frequency, L is the loop inductance, and R is the loop resistance. Both the inductance, L and resistance, R are generally quite small, so even at high frequencies around 4-10 Khz, this still presents a low impedance load to the drive transformer 208, and significant currents are circulated in the ground loop 104, 106 and 108.

A second split-core transformer 210 is included in the jaws of the ground clamp probe 202 comprising M turns, where M is at least 300 turns and terminated by low impedance. This CT sense coil 210, in conjunction with the single-turn ground loop 106, comprises a current transformer with a current ratio of M:1. Thus, if a ~20 A peak current is caused to flow through the ground loop 104, 106 and 108 as previously described, then a sense coil current of 20/M amps peak will flow through the sense coil 210.

A single-turn voltage sense coil 212 is also included, and is terminated in by high impedance. By measuring the output of both the Vtg sense coil 212 (voltage) and the CT sense coil 210 (current), the impedance of the ground loop can be calculated.

Figure 3:
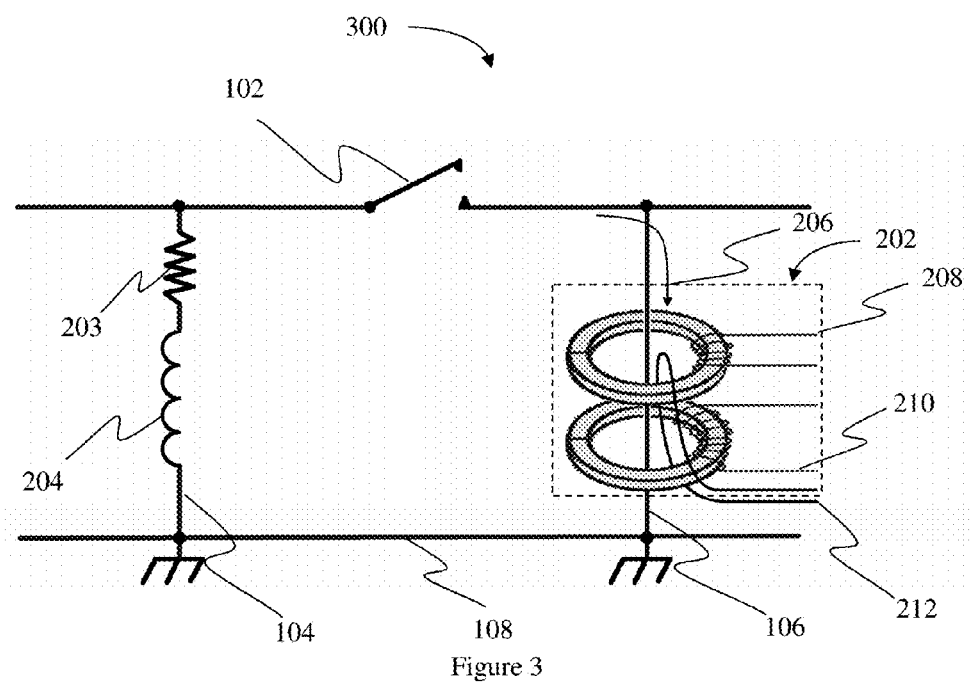
FIG. 3 is a diagram of the ground clamp probe attached to the circuit breaker, where the circuit breaker is in an open position.

Referring now to FIG. 3, there is shown diagram 300 of the ground clamp probe 202 attached to the circuit breaker 102, where the circuit breaker 102 is in an open position.

If the circuit breaker 102 is open, as shown in FIG. 3, the secondary of the drive transformer 208 is simply a single-turn open secondary. In this case there is no ground loop current, $I_{loop}$ 206, and the sense coil 210 does not sense any current flow.

Figure 4:
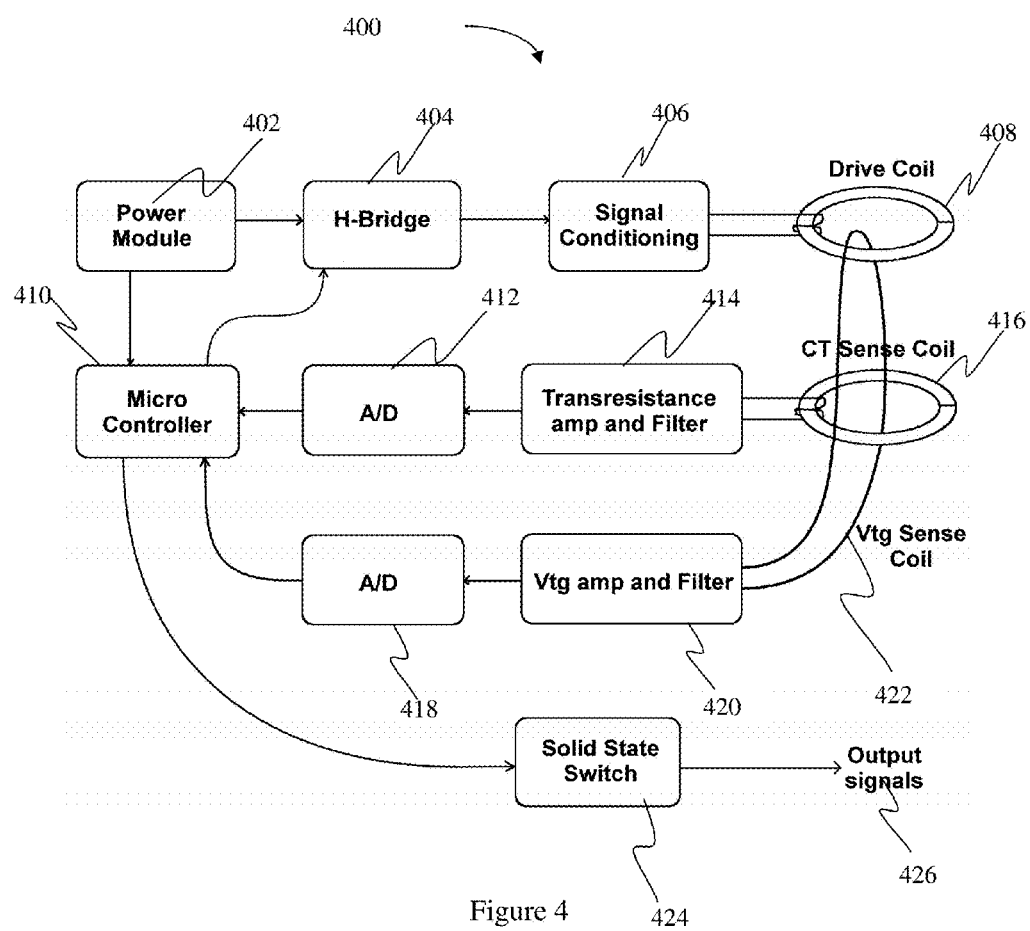
FIG. 4 is a diagram of the ground clamp probe components according to one embodiment.

Referring now to FIG. 4, there is shown diagram 400 of the ground clamp probe 202 components according to one embodiment. As can be seen the ground clamp probe 202 comprises at a minimum a power module 402 connected to an H-bridge 404 that is connected to a signal conditioner 406 and a drive coil 408. A sense coil 416 is connected to a transresistance amplifier and filter 414 through a first analog-to-digital (A/D) converter 412 to a microcontroller 410. The microcontroller is connected to a solid state switch 424 that outputs signals 426 to indicate the state of the circuit breaker 102.

The ground clamp probe 202 is powered by the power module 402. In one embodiment, the power module 402 can be external to the ground clamp probe 202 adding an additional level of safety. The power module 402 provides low-voltage DC power to both the H-bridge 404 and the microcontroller 410.

Under the control of the microcontroller 410 that comprises the instructions for the operation of the ground clamp probe 202, the H-bridge 404 can switch the DC input voltage from the power module 402 to form a bi-directional pulsed waveform drive. Since the drive coil 408 will present a load that varies from high impedance (circuit breaker open) to a very low impedance (circuit breaker closed) the signal conditioning circuitry provides both pulse-shaping and current limit functions.

The drive coil 408 is contained within the jaws of the ground clamp probe 202 and is magnetically and electrically shielded and isolated from the sense coil 416. The drive coil 408, comprised of N turns on a split core and acts as a N:1 transformer with the circuit breaker ground loop 104, 106 and 108. This circuit breaker ground loop 104, 106 and 108 will present a low impedance to the secondary of the transformer if the circuit breaker 102 is closed, causing high currents to flow in the ground loop The sense coil 416 is contained within the jaws of the ground clamp probe 202 and is magnetically and electrically shielded and isolated from the drive coil 408. The sense coil 416, comprised of M turns on a separate split core acts as a M:1 current transformer with the circuit breaker ground loop 104, 106 and 108. The sense coil 416 will output a current of $I_{loop}/M$ that is then transmitted to the transresistance amplifier and filter 414.

The transresistance amplifier and filter 414 converts the current output of the sense coil 210 to a voltage suitable for input to the analog to digital converter 412. Filtering is included to smooth the waveform and provide power line frequency rejection. Amplitude clipping is also provided to ensure that the analog to digital converter 412 is not overdriven.

The drive coil 408 voltage and current are controlled by a microcontroller 410 that comprises instructions that can drive a H-bridge 404 at a frequency f and a programmable duty cycle. The frequency, f, is chosen to be high enough to accurately time the breaker, but low enough that the loop current is not severely limited by the loop inductance L. In practice, the frequency is between 4 to 20 Khz, but, depending on the circuit breaker 102 the frequency can be between 1 to 40 Khz. The duty cycle is adjusted to give the desired drive current into a standard load, and can accommodate a wide range of variation in the magnetic path, which may be a result of manufacturing tolerances.

The microcontroller 410 also processes the output signals of the analog to digital converters 412 and 418, one for current 412, and one for voltage 418, and based on the sensed current and voltage, calculates if the circuit breaker 102 is open or closed. The microcontroller 410 also comprises instructions capable of calculating the impedance of the ground loop 104, 106 and 108 over a wide range, 1 milli-ohm to 100 ohms. By oversampling the waveform by an order of magnitude or more, the microcontroller 410 is able to quickly determine circuit breaker 102 open and close events at the terminals. When such an open or close event is detected, the output signal 426 from the ground clamp probe 202 is change to reflect the current state of the circuit breaker 102. Note: it may not be necessary to include the voltage sense circuits, as current sense alone may be sufficient for operation as described.

The microcontroller 410 comprises instructions capable of adapting the sense thresholds to more accurately measure the circuit breaker 102 that are still closed, but have a higher than expected loop impedance, due either to a very long ground loop (high L) or due to a higher than expected contact resistance (high R).

The microcontroller 410 ultimately controls the solid state switch 424. The output of the solid state switch 424 is suitable for interfacing to conventional circuit breaker 102 timing equipment, reflects the state of the circuit breaker 102 contacts, and effectively isolated the effects of the safety grounds from the circuit breaker 102 timing equipment.

Figure 5:
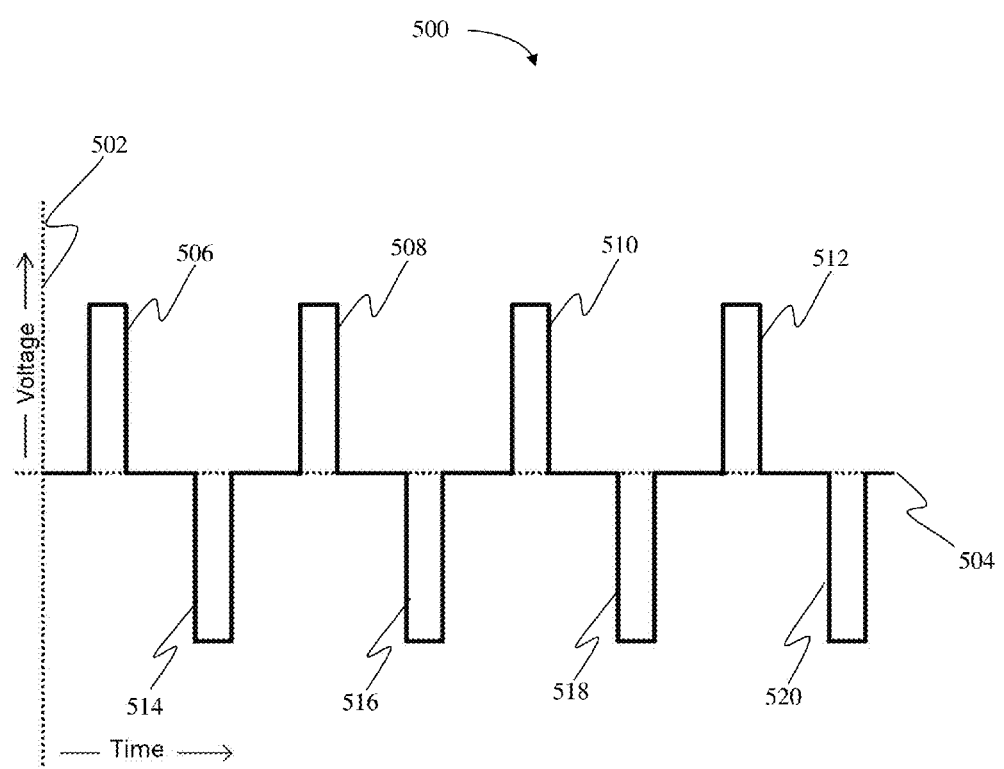
FIG. 5 is a plot of excitation voltage applied to the circuit breaker ground loop with respect to time during normal operation.

Referring now to FIG. 5, there is shown a plot 500 of excitation voltage 502 applied to the drive coil and induced into the drive transformer secondary, the ground loop, with respect to time 504 during normal operation. As can be expected, the square wave form 506, 508, 510, 512, 514, 516, 518 and 520 supplied by the ground clamp probe 202 are not interrupted during normal operation.

Figure 6:
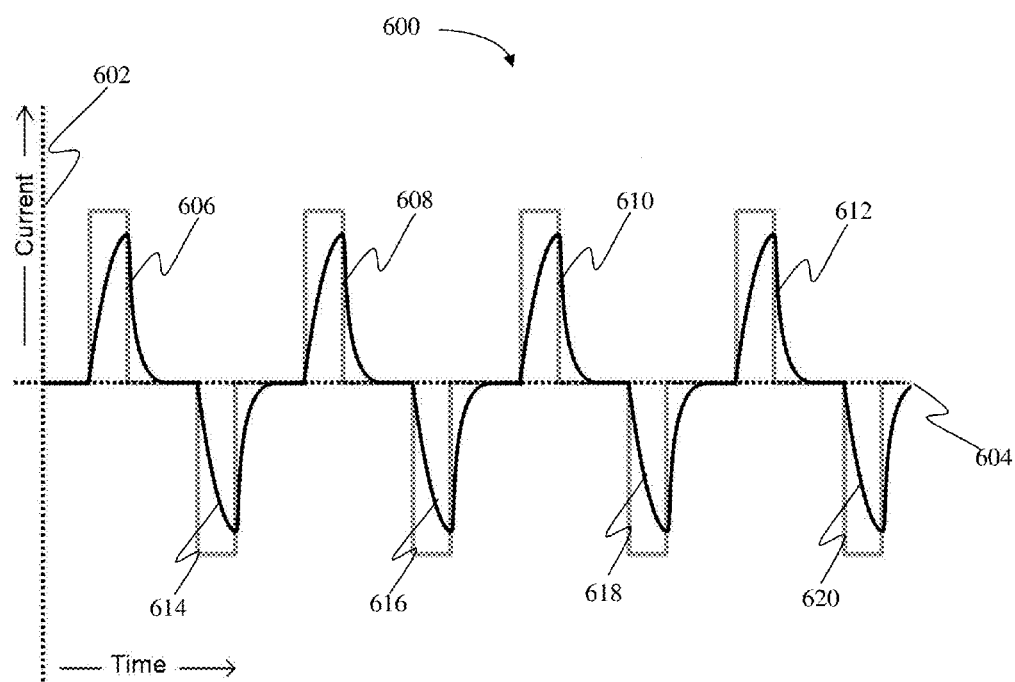
FIG. 6 is a plot of current through a closed circuit breaker with respect to time during normal operation as detected by the ground clamp probe.

Referring now to FIG. 6, there is shown a plot 600 of current 602 through the closed contacts of circuit breaker 102 with respect to time 604 during normal operation as detected by the ground clamp probe 202. As can be seen, the current 606, 608, 610, 612, 614, 616, 618 and 620 follow the voltage 506-520 during normal operation.

Figure 7:
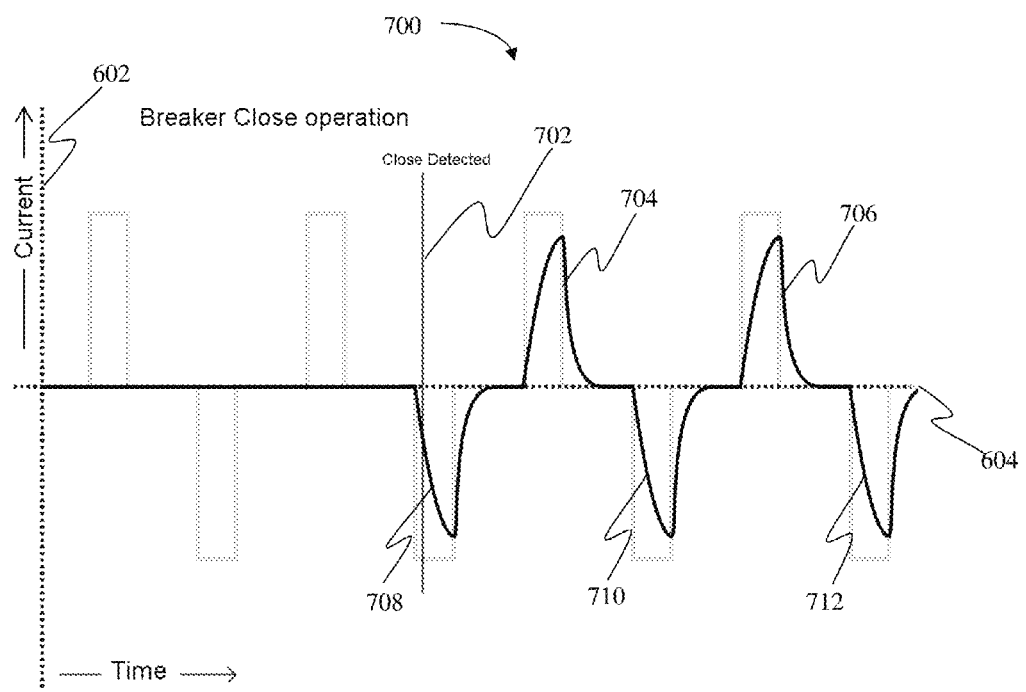
FIG. 7 is a plot of current through the circuit breaker with respect to time where a close condition is detected by the ground clamp probe.

Referring now to FIG. 7, there is shown a plot of current 602 through the circuit breaker 102 with respect to time 604 where an open to closed transition is detected by the ground clamp probe. When the ground clamp probe 202, initially checks the circuit breaker 102 during a close operation, there is no current flowing through the ground loop 104, 106 and 108. Once the circuit breaker 102 is closed 702, current 704, 706, 708, 710 and 712 will flow normally through the ground loop 104, 106 and 108 and be detectable by the ground clamp probe 202 verifying the operation of the circuit breaker 102 for this operation while both sides of the circuit breaker 102 are still grounded 104 and 106.

Figure 8:
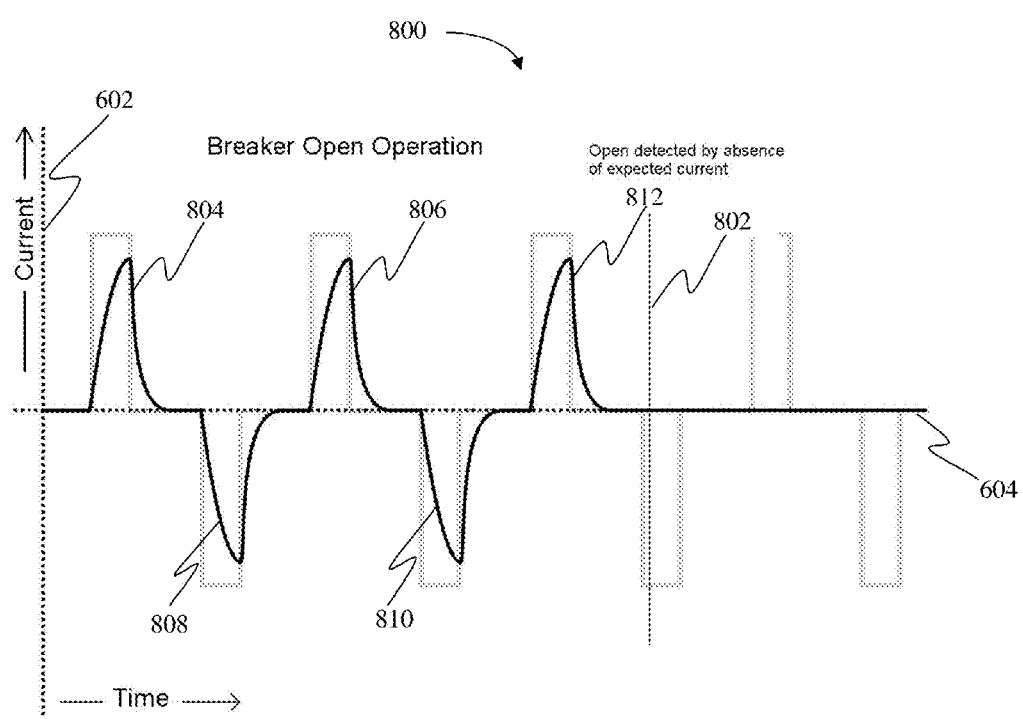
FIG. 8 is a plot of current through the circuit breaker with respect to time where an open condition is detected by the ground clamp probe.

Referring now to FIG. 8, there is shown a plot of current 602 through the circuit breaker 102 with respect to time 604 where an closed to open transition is detected by the ground clamp probe. As can be seen, the current 804, 806, 808, 810 and 812 flows through the ground loop 104, 106 and 108 until the circuit breaker 102 is opened 802. The ground clamp probe 202 detects the circuit breaker 102 open condition 802 to verify that the circuit breaker 102 is functioning as expected. Again, this test is performed with both sides of the circuit breaker 102 being grounded 104 and 106 making the testing of the circuit breaker far safer than was previously accomplished using the prior art.

Figure 9:
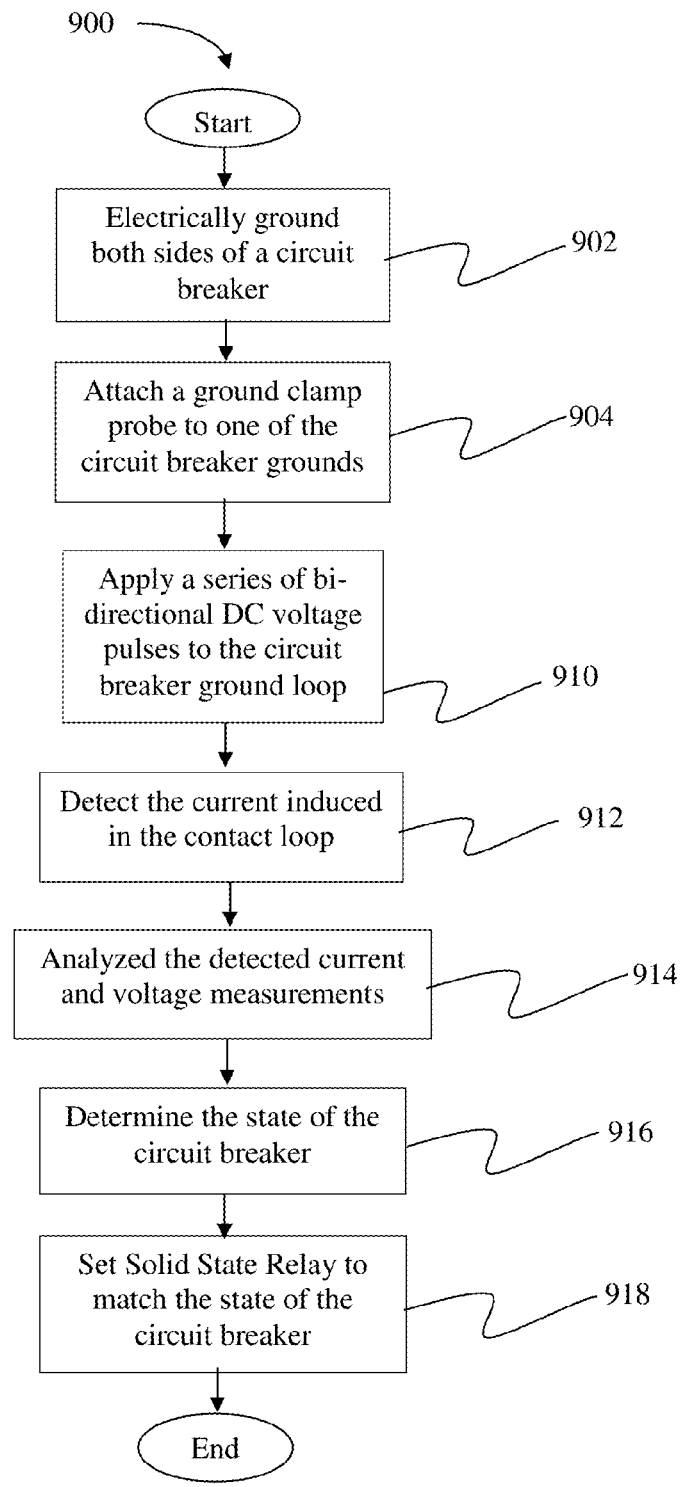
FIG. 9 is a flowchart of a method for using the system to test the circuit breaker.

FIG. 9 is a flowchart 900 of a method for using the system to test the circuit breaker. First, the circuit breaker 102 contacts are electrically grounded 902 on both sides 104 and 106 by coupling the load-side contact and the line-side contact of a circuit breaker to electrical ground. Then, a ground clamp probe 202 is attached 904 to one of the circuit breaker 102 grounds, by means of clamp-on transformers, magnetically coupling the ground clamp probe to the ground loop 104, 106 and 108 created by the electrical grounds 104 and 106 and the circuit breaker 102 contact pair. Next, an excitation voltage and current is induced into the circuit breaker contact ground loop 104, 106 and 108 by exciting the primary winding 208 of the clamp-on transformer 206 with a series of bi-directional DC voltage pulses 910. Next, the ground clamp probe 202 detects the current induced in the contact loop 910 by means of a current transformer in the clamp on transformer. Then, the detected current and voltage measurements are analyzed 912 by the ground clamp probe 202. Finally, the state of the circuit breaker 102 contact pair is determined 914 based upon the current and voltage measurements 916 and the solid state relay output 918 is set to match the state of the circuit breaker.

What has been described is a new and improved system that tests substation circuit breakers while the circuit breakers are grounded on both sides providing increased safety, overcoming the limitations and disadvantages inherent in the related art.

Although the present invention has been described with a degree of particularity, it is understood that the present disclosure has been made by way of example and that other versions are possible. As various changes could be made in the above description without departing from the scope of the invention, it is intended that all matter contained in the above description or shown in the accompanying drawings shall be illustrative and not used in a limiting sense. The spirit and scope of the appended claims should not be limited to the description of the preferred versions contained in this disclosure.

All features disclosed in the specification, including the claims, abstracts, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means" for performing a specified function or "step" for performing a specified function should not be interpreted as a "means" or "step" clause as specified in 35 u.s.c. §112.

What is claimed is:

1. A system for testing substation circuit breakers while the circuit breakers are grounded on both sides, the system comprising: a) a substation circuit breaker grounded on both sides of the circuit breaker contacts; b) a ground clamp probe electrically connectable to one side of the circuit breaker contacts, where the ground clamp probe provides a means of interfacing standard test equipment to the circuit breaker without removing either safety ground; and c) a microcontroller communicatively coupled to the ground clamp probe comprising instructions for analyzing the circuit breaker, where the microcontroller comprises instructions to: a) calculate the impedance of a ground loop; b) operate the ground clamp probe, an H-bridge and a solid state switch; c) control the H-bridge to switch DC input voltage from a power module to form a bi-directional pulsed waveform drive; d) control drive coil voltage and current; e) drive the H-bridge at a frequency f and a programmable duty cycle, where the frequency, f, is chosen to be high enough to accurately time the breaker, but low enough that loop current is not severely limited by loop inductance L; and the duty cycle can be adjusted to give the desired drive current into a standard load; f) process output signals of analog-to-digital converters, a first analog-to-digital converter for current, and a second analog-to-digital converter for voltage; g) calculate if the substation circuit breaker is open or closed based on sensed current and voltage; h) control the solid state switch: and i) to adapt sense thresholds to more accurately measure the circuit breaker.

2. The system of claim 1, where the two safety grounds and an earth ground between them forms a closed ground loop consisting of the grounding circuit and the circuit breaker contacts, where the ground loop provides a closed path to circulate induced current if the circuit breaker contacts are closed, but will not provide a closed path for circulating currents if the circuit breaker contacts are open.

3. The system of claim 1, where the ground clamp probe comprises two split-core transformers with isolated and shielded cores that can be clamped onto one of the safety ground wires.

4. The system of claim 3, where the split-core transformers are fitted into the jaws of a hand-operated self-closing clamp.

5. The system of claim 3, where the split-core design comprises a drive coil and a current sense coil, where the sense coil is magnetically and electrically shielded and isolated from the drive coil.

6. The system of claim 5, where the drive coil can apply a high frequency AC voltage to induce a flux current that will couple to the ground loop acting as a shorted secondary of a drive transformer.

7. The system of claim 6, where the drive coil comprises N turns to form a N:1 transformer with the single turn ground loop passing through the center of the jaws.

8. The system of claim 7, where N is at least 20 turns to produce a large current that is easily detectable by the sense transformer.

9. The system of claim 1, where the frequency is between 1 to 40 Khz.

10. The system of claim 1, where the frequency is between 4 to 20 Khz.

11. The system of claim 1, where the impedance is calculated using a resistance and an inductance of the ground loop with a closed circuit breaker using the formula $Z=j2\pi fL+R$, where f is the drive coil AC frequency, L is the loop inductance, and R is the loop resistance.

12. The system of claim 11, where the frequency is around 4-10 Khz.

13. The system of claim 11, where the calculated impedance of the ground loop is between 1 milli-ohm to 100 ohms.

14. The system of claim 5, where the current sense coil comprises M turns and terminated by low impedance.

15. The system of claim 14, where M is at least 300 turns.

16. The system of claim 14 where the current sense coil and the single-turn ground loop comprise a current transformer with a current ratio of M:1.

17. The system of claim 1, further comprising a single-turn voltage sense coil terminated in by high impedance.

18. The system of claim 1, where an impedance of the loop can be calculated by the microcontroller using measurements from the output of both the voltage sense coil and the current sense coil.

19. The system of claim 1, where the ground clamp probe comprises: a) a power module; b) an H-bridge connected to the power module; c) a signal conditioner connected to the H-bridge; d) a drive coil connected to the H-bridge; e) a microcontroller electrically connected to the power module and communicatively coupled to the H-bridge and a first and second analog-to-digital converter and a solid state switch; f) a transresistance amplifier and filter connected to the first analog-to-digital converter; g) a current sense coil electrically connected to the transresistance amplifier and filter; and h) a voltage sense coil electrically connected to the second analog-to-digital converter.

20. The system of claim 19, where the power module is external to the ground clamp probe for additional safety.

21. The system of claim 19, where the transresistance amplifier and filter converts the current output of the sense coil to a voltage suitable for input to the first analog-to-digital converter.

22. The system of claim 21, where the transresistance amplifier and filter is configured to smooth the waveform and provide power line frequency rejection.

23. The system of claim 21, where the transresistance amplifier and filter is configured to amplitude clip the voltage output by the transresistance amplifier to ensure that the first analog-to-digital converter is not over-driven.

24. The system of claim 21, where the output of the solid state switch is suitable for interfacing to conventional circuit breaker timing equipment, reflects the state of the circuit breaker contacts, and effectively isolated the effects of the safety grounds from the circuit breaker timing equipment.

* * * * *